US012733444B2

(12) United States Patent
Kim et al.

(10) Patent No.: US 12,733,444 B2
(45) Date of Patent: Sep. 8, 2026

(54) ELECTROSTATIC CHUCK

(71) Applicant: Samsung Electronics Co., Ltd., Suwon-si (KR)

(72) Inventors: Junhyung Kim, Suwon-si (KR); Hyunjoo Jeon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 207 days.

(21) Appl. No.: 18/621,553

(22) Filed: Mar. 29, 2024

(65) Prior Publication Data

US 2024/0363383 A1 Oct. 31, 2024

(30) Foreign Application Priority Data

Apr. 25, 2023 (KR) ........................ 10-2023-0054012

(51) Int. Cl.
*H10P 72/72* (2026.01)
*H01J 37/32* (2006.01)

(52) U.S. Cl.
CPC ...... *H10P 72/722* (2026.01); *H01J 37/32715* (2013.01); *H01J 2237/2007* (2013.01); *H01J 2237/334* (2013.01)

(58) Field of Classification Search
CPC . H01L 21/6831; H01L 21/6833; H02N 13/00; H10P 72/722
See application file for complete search history.

(56) References Cited

U.S. PATENT DOCUMENTS 9,583,371 B2 2/2017 Shim et al.
11,521,837 B2 12/2022 Koiwa
2010/0027188 A1 2/2010 Liu et al.
2014/0069585 A1* 3/2014 Aoto ................ H01J 37/32807 156/345.52
2015/0187614 A1 7/2015 Gaff et al.
2018/0151402 A1 5/2018 Noorbakhsh (Continued)

FOREIGN PATENT DOCUMENTS

CN 108695225 A 10/2018
CN 213026046 U 4/2021

(Continued)

OTHER PUBLICATIONS

Korean Office Action dated Jan. 27, 2026 issued in Korean Patent Application No. 10-2023-0054012.

(Continued)

*Primary Examiner* — Thienvu V Tran
*Assistant Examiner* — Christopher J Clark
(74) *Attorney, Agent, or Firm* — Harness, Dickey & Pierce, P.L.C.

(57) ABSTRACT

An electrostatic chuck comprising; an electrostatic chuck body configured to have a step protruding from a lower end thereof in a radial direction, an adhesive layer on an upper surface of the electrostatic chuck body, a ceramic puck configured to be adhered to the adhesive layer and configured to have an edge protruding from the upper surface of the electrostatic chuck body, and a sealing member on a lower portion of an edge of the ceramic puck. The electrostatic chuck body is provided with an installation portion configured to have an inclined surface, and the sealing member is configured to be in contact with the inclined surface.

17 Claims, 8 Drawing Sheets

(56) References Cited

U.S. PATENT DOCUMENTS

| | | | | |
|---|---|---|---|---|
| 2020/0161103 | A1 | 5/2020 | Liu | |
| 2020/0273680 | A1* | 8/2020 | Koiwa | C23C 16/4585 |
| 2022/0102181 | A1* | 3/2022 | Ono | H01L 21/67103 |
| 2022/0139680 | A1 | 5/2022 | Lee et al. | |

FOREIGN PATENT DOCUMENTS

| | | | |
|---|---|---|---|
| CN | 114649178 | A | 6/2022 |
| EP | 0742580 | A2 | 11/1996 |
| JP | 2005033181 | A | 2/2005 |
| JP | 2017-168649 | A | 9/2017 |
| JP | 2022-175820 | A | 11/2022 |
| KR | 10-2019-0078656 | A | 7/2019 |
| KR | 10-2022-0167832 | A | 12/2022 |

OTHER PUBLICATIONS

Korean Office Action dated Jan. 6, 2026 issued in Korean Patent Application No. 10-2023-0054012 (Translation not available).

* cited by examiner

ELECTROSTATIC CHUCK

CROSS-REFERENCE TO RELATED APPLICATION(S)

This application claims the benefit under 35 USC 119(a) of Korean Patent Application No. 10-2023-0054012 filed on Apr. 25, 2023 in the Korean Intellectual Property Office, the entire disclosure of which in its entirety is incorporated herein by reference for all purposes.

BACKGROUND

Various example embodiments relate to an electrostatic chuck.

Semiconductor devices, thin film solar cells, display devices, micro-electro-mechanical Systems (MEMS), photonics, optoelectronics, microfluidics, and other advanced technologies are manufactured by laminating and patterning a plurality of thin film layers including a dielectric layer and a metal layer on at least one of a glass substrate, a flexible substrate, a semiconductor wafer substrate, or the like, by advanced manufacturing processes such as a chemical vapor deposition (CVD), a physical vapor deposition (PVD), ion implantation, and etching processes.

In chamber devices for performing these semiconductor processes, Electro Static Chucks (ESCs) are used and configured to support various substrates such as glass substrates, flexible substrates and semiconductor wafer substrates, and in detail, for fixing the substrate using electrostatic force and/or for plasma processing. In addition, the electrostatic chuck may be provided with an adhesive layer for bonding a ceramic plate on which the substrate is configured to be seated to the electrostatic chuck body, and, a sealing member for protecting the adhesive layer may be provided in the electrostatic chuck.

A sealing member formed of or in the shape of an O-ring is generally mounted in an electrostatic chuck with a length longer than the initial length. The cross-sectional area of the sealing member, when being installed in the electrostatic chuck, is reduced by Poisson's ratio after being stretched (tensile deformation) due to the elasticity of the sealing member, and a gap may occur between the sealing member and the ceramic puck and/or between the sealing member and the electrostatic chuck, which may allow for the reactive gas to penetrate into the gap and potentially react with the adhesive layer. This may compromise the adhesion between the ceramic puck and the electrostatic chuck body, which can lead to early failure of the electrostatic chuck.

SUMMARY

Various example embodiments provide an electrostatic chuck in which process gasses may be prevented or reduced from flowing into a sealing member.

According to example embodiments, an electrostatic chuck comprising; an electrostatic chuck body configured to have a step protruding from a lower end thereof in a radial direction, an adhesive layer on an upper surface of the electrostatic chuck body, a ceramic puck adhered to the adhesive layer and having an edge protruding from the upper surface of the electrostatic chuck body, and a sealing member on a lower portion of an edge of the ceramic puck. Wherein the electrostatic chuck body is provided with an installation portion configured to have an inclined surface, and the sealing member is configured to be in contact with the inclined surface.

According to further example embodiments, an electrostatic chuck comprising; an electrostatic chuck body having a step protruding from a lower end thereof in a radial direction, an adhesive layer on an upper surface of the electrostatic chuck body, a ceramic puck adhered to the adhesive layer and having an edge protruding from the upper surface of the electrostatic chuck body, and a sealing member below the edge of the ceramic puck. Wherein the electrostatic chuck body is provided with an installation portion having an inclined surface, and the sealing member includes a material having elasticity and is configured to generate a restoring force by tension when installed on the installation portion.

BRIEF DESCRIPTION OF DRAWINGS

The above and other aspects, features, and advantages of various example embodiments may be more clearly understood from the following detailed description, taken in conjunction with the accompanying drawings, in which.

DETAILED DESCRIPTION

Hereinafter, various example embodiments may be described with reference to the accompanying drawings.

Figure 1:
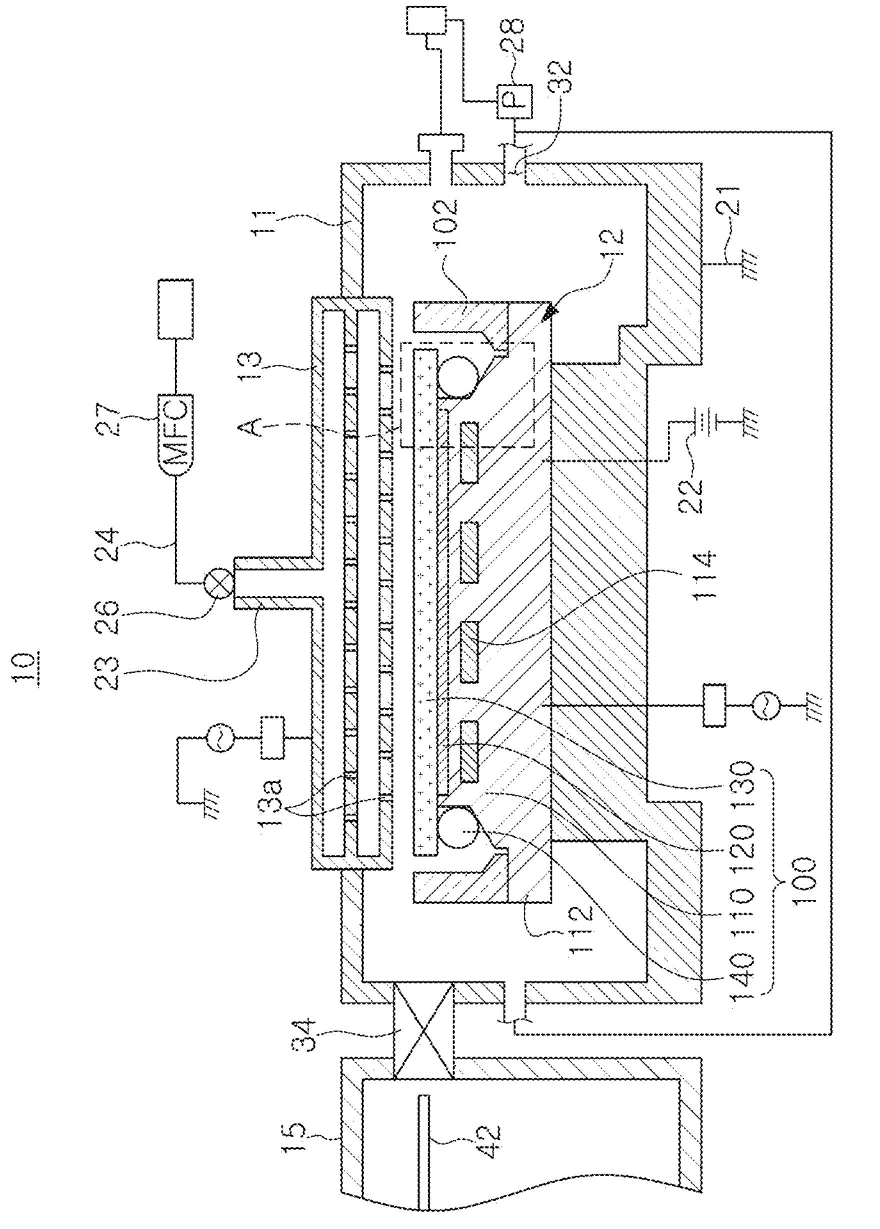
FIG. 1 is a configuration diagram illustrating a process chamber apparatus including an electrostatic chuck according to some example embodiments.

FIG. 1 is a configuration diagram illustrating a process chamber apparatus having an electrostatic chuck according to example embodiments.

Referring to FIG. 1, a process chamber apparatus 10 includes a reaction chamber 11 in which a substrate (not illustrated) such as a glass substrate, a flexible substrate, a semiconductor wafer substrate, or the like is loaded. The reaction chamber 11 provides a space in which one or more of an etching, CVD, PVD, or implant process on the loaded wafer may be performed, and includes a susceptor 12 having an electrostatic chuck 100 on which a substrate is seated, and an upper electrode 13 disposed or arranged on the susceptor 12. Each of the susceptor 12 and the upper electrode 13 in the example embodiments has a substantially cylindrical shape, however example embodiments are not limited thereto; for example, the susceptor and upper electrode could have an elliptical or rectangular shape, and the reaction chamber 11 may be grounded through a ground line 21.

The electrostatic chuck 100 is disposed or arranged in an upper portion of the susceptor 12 to fix the substrate. The electrostatic chuck 100 includes a conductive thin film or a thin metal electrode disposed inside a ceramic such as, but not limited to, aluminum nitride (AlN) or aluminum oxide ($Al_2O_3$). The conductive thin film or metal electrode is connected to a high-voltage direction current (DC) power source 22 disposed outside the reaction chamber 11.

When a predetermined or dynamically determined voltage from the high-voltage DC power source 22 is applied to the conductive thin film or metal electrode, charges are generated on the surface of the ceramic or metal electrode to generate a Coulomb force to fix the wafer to the upper surface of the electrostatic chuck 100. However, the method of fixing the wafer is not limited to the method using an electrostatic chuck, but other methods such as one or more of mechanical clamping, vacuum chucking, magnetic chucking, thermal chucking, adhesive methods, or the like may also be used.

In some example embodiments, the upper electrode 13 is disposed or arranged above the electrostatic chuck 100 to face the susceptor 12. The lower end of the upper electrode 13 may be formed of or include silicon to stabilize the atmosphere, e.g., the pressure, inside the reaction chamber 11 during an etching process; however, example embodiments are not limited thereto. In some example embodiments, silicon may be thick enough to sufficiently transmit high-frequency power used for plasma etching. In addition, the upper electrode 13 may include parts formed of or include one or more of aluminum, anodized aluminum, or stainless steel; however, example embodiments are not limited thereto. Alternatively or additionally, in some example embodiments an upper electrode, or lower electrode may not be present, for example a PVD process chamber, or an ion implant chamber.

In some example embodiments, a gas inlet 23 for supplying gases for an etching process, or CVD process, is disposed on the upper electrode 13. The gas inlet 23 is connected to a reaction gas supply source 25 through a gas supply line 24, and a valve 26 and a mass flow controller (MFC) 27 for control of a flow rate are disposed on the gas supply line 24. In this example embodiment, the upper electrode 13 may be a path through which the reaction gas is supplied into the reaction chamber 11. The upper electrode 13 may be formed of a single layer, or a plurality of layers having a plurality of diffusion holes **13*a*. Also, the lower end of the upper electrode 13** may have a shower head structure and a hollow structure for uniform gas distribution. In other example embodiments an upper electrode, or lower electrode may not be present, and the gas distribution may be configured to enter the chamber through different means; for example, a PVD process chamber, or an ion implant chamber.

In some example embodiments, the reaction chamber 11 may be connected to a predetermined or dynamically determined pressure reducing device 28 (e.g., a vacuum pump) through an exhaust pipe 32 disposed in a predetermined or dynamically determined area. Accordingly, in some example embodiments, the reaction chamber 11 may provide a relatively low internal pressure required for excellent etching or deposition characteristics. A gate valve 34 may be disposed on the sidewall of the reaction chamber 11, and a load lock chamber 15 in which a wafer transfer arm 42 is disposed may be connected to the gate valve 34.

In some example embodiments, the operation of carrying the wafer into the reaction chamber 11, after reducing the pressure of the load lock chamber 15 to a similar magnitude to pressure of the reaction chamber 11 may occur. A wafer may then be transferred from the load lock chamber 15 to the reaction chamber 11 using the wafer transfer arm 42. After the wafer transfer arm 42 is retracted from the reaction chamber 11 to the load lock chamber 15, the gate valve 34 is closed.

Figure 2:
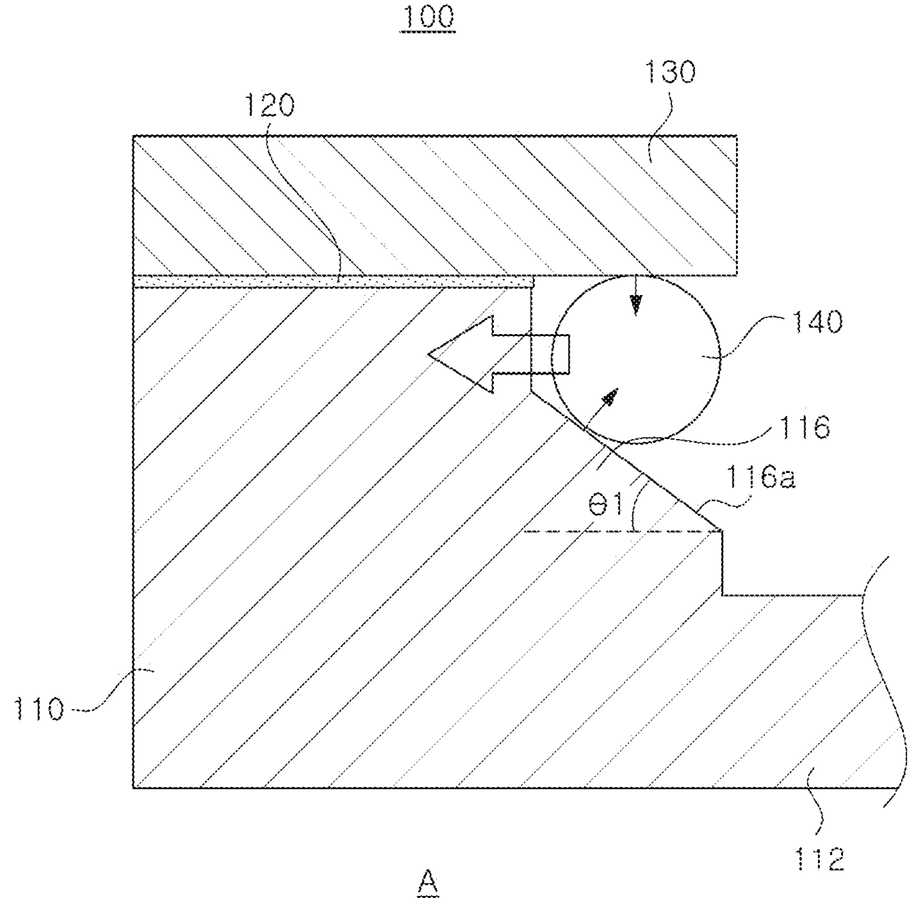
FIG. 2 is an enlarged view illustrating part A of FIG. 1

FIG. 2 is an enlarged view illustrating part A of FIG. 1.

Referring to FIG. 2, the electrostatic chuck 100 according to some example embodiments may include an electrostatic chuck body 110, an adhesive layer 120, a ceramic puck 130, and a sealing member 140.

The electrostatic chuck body 110 may have a protrusion 112 protruding in a radial direction at a lower end thereof. An edge ring 102 may be installed at the edge of the protrusion 112. As an example, the electrostatic chuck body 110 may be formed of a material including aluminum, or stainless steel. In further example embodiments, a heater electrode 114 may be provided in or adjacent to the electrostatic chuck body 110. The heater electrode 114 may be formed of a conductor, for example, the conductor may comprise at least one of a metal such as tungsten (W), copper (Cu), nickel (Ni), molybdenum (Mo), titanium (Ti), nickel-chromium alloy (Ni—Cr alloy), nickel-aluminum alloy (Ni—Al alloy) or the like, or conductive ceramics such as tungsten carbide (WC), molybdenum carbide (MoC), titanium nitride (TiN), or the like. In one or more example embodiments, the heater electrode 114 may be electrically connected to a heater power source (not illustrated). The heater power source may be configured to supply AC voltage, for example, to the heater electrode 114 to heat the heater electrode 114. Accordingly, temperatures of the electrostatic chuck body 110 and the wafer may be adjusted by modulating the supplied power. In some example embodiments, the heater electrode 114 may have a concentric or spiral pattern, however example embodiments are not limited thereto. Furthermore, the electrostatic chuck body 110 may be provided with an installation portion 116 on which the sealing member 140 is installed. The installation portion 116 is disposed or arranged on an upper portion of the protrusion part 112 and provides an installation space in which the sealing member 140 may be installed, together with the ceramic puck 130. As an example, the installation portion 116 may be provided with an inclined surface **116*a***. A detailed description thereof may be provided later.

The adhesive layer 120 is disposed or arranged on the upper surface of the electrostatic chuck body 110. In some example embodiments, the adhesive layer 120 serves to bond the ceramic puck 130 to the upper portion of the electrostatic chuck body 110. Furthermore, the adhesive layer 120 may be for example, a ceramic bond formed by, but not limited to, brazing, sintering, or adhesive bonding.

The ceramic puck 130 is adhered to the adhesive layer 120 and is disposed such that an edge protrudes from the upper surface of the electrostatic chuck body 110. In some example embodiments, a substrate is seated on the upper surface of the ceramic puck 130 during the process.

The sealing member 140 may be inserted into the installation portion 116 to prevent or reduce the reaction gas from permeating into the adhesive layer 120. In some example embodiments, the sealing member 140 may be formed of a material having elasticity. For example, the sealing member 140 may have a ring shape having a circular cross section. Furthermore, the sealing member 140 may be installed into the installation portion 116 by utilizing the elastic properties (tensile deformation) of the sealing member 140 and stretching to a size larger than the initial size. The sealing member 140 may then be inserted into the installation portion 116 which contacts the inclined surface **116*a* of the installation portion 116 and the lower surface of the ceramic puck 130**.

The sealing member 140 installed into the installation portion 116 generates a force in the lateral direction due to the restoring elastic force generated by the sealing member 140 The force generated in this lateral direction provides sufficient contact pressure for sealing the inclined surfaces 116*a* and the lower surface of the ceramic puck 130 with respect to the sealing member 140.

Figure 3:
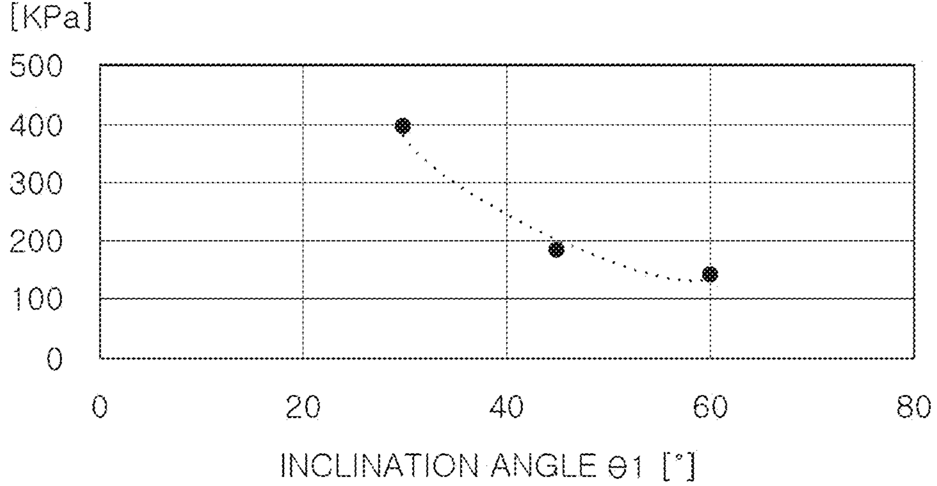
FIG. 3 is a graph illustrating the contact pressure according to an angle of inclination of the inclined surface provided on the installation portion.

As illustrated in FIG. 3, the contact pressure generated by the sealing member 140 changes according to the angle of inclination θ1 of the inclined surface 116*a* of the installation portion 116. It can be seen that the contact pressure decreases when the angle of inclination θ1 increases.

Since the sealing member 140 is formed of a material having elasticity and is installed on the installation portion 116 having contact with the inclined surface 116*a*, the inside of the sealing member 140 may be sealed. Accordingly, the adhesive layer 120 may be prevented from or reduced in likelihood of being damaged by the process gas.

Figure 4:
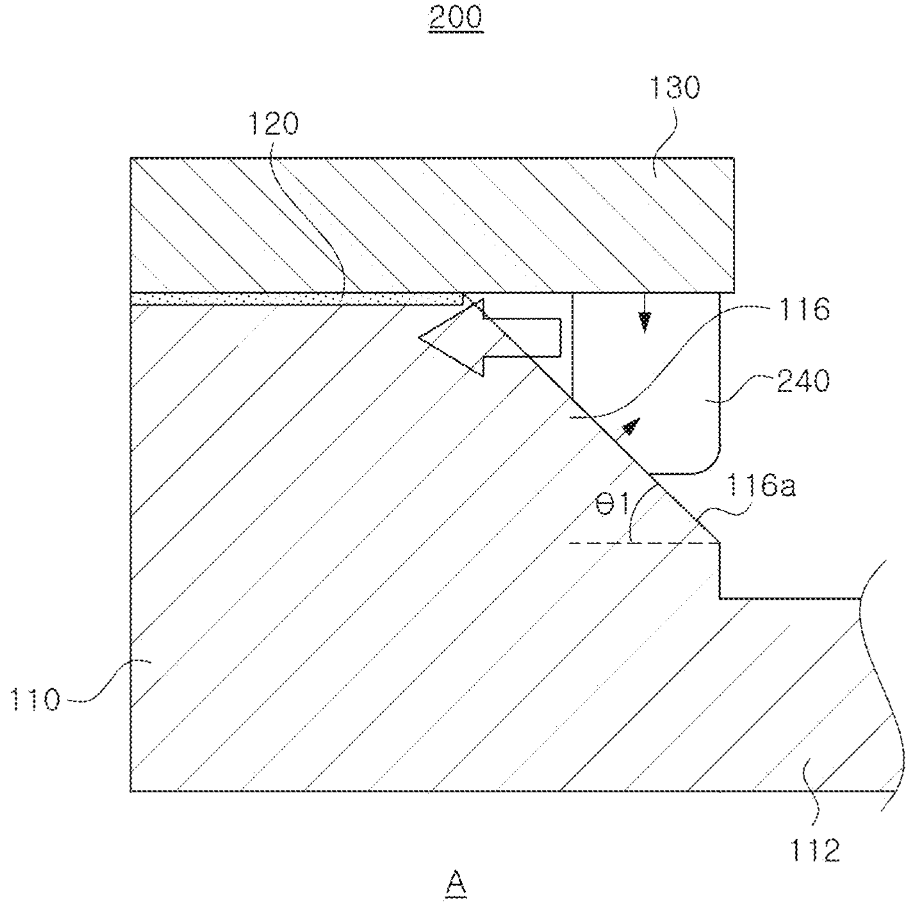
FIG. 4 is an enlarged view illustrating a region corresponding to FIG. 2 in an electrostatic chuck according to some example embodiments.

FIG. 4 is an enlarged view illustrating a region corresponding to FIG. 2 of an electrostatic chuck according to an example embodiment.

Referring to FIG. 4, an electrostatic chuck 200 according to an example embodiment includes an electrostatic chuck body 110, an adhesive layer 120, a ceramic puck 130, and a sealing member 240.

In the following example embodiments, since the electrostatic chuck body 110, the adhesive layer 120, and the ceramic puck 130 are substantially the same as the components described above, a detailed description thereof may be omitted and may be replaced with the above description.

The sealing member 240 may be inserted into the installation portion 116 and prevents the reaction gas from permeating into the adhesive layer 120. In some example embodiments, the sealing member 240 may be formed of a material having elasticity. As an example, the sealing member 240 may have a trapezoidal cross section and a ring shape. Furthermore, the sealing member 240 may be installed into the installation portion 116 by utilizing the elastic properties (tensile deformation) of the sealing member 240 and stretching to a size larger than the initial size. The sealing member 240 may then be inserted into the installation portion 116 which contacts the inclined surface 116*a* of the installation portion 116 and the lower surface of the ceramic puck 130. The sealing member 240 installed into the installation portion 116 generates a force in the lateral direction due to the restoring elastic force generated by the sealing member 240. The force generated in this lateral direction provides sufficient contact pressure for sealing the inclined surfaces 116*a* and the lower surface of the ceramic puck 130 with respect to the sealing member 240.

Since the cross section of the sealing member 240 has a trapezoidal shape, the upper surface of the sealing member 240 may be in surface contact with the lower surface of the ceramic puck 130. The inclined portion of the sealing member 240 comes into surface contact with the inclined surface 116*a* of the installation portion 116. In some example embodiments, one surface of the sealing member 240 having a trapezoidal shape may be in surface contact with the inclined surface 116*a*, and another surface of the sealing member 240 may be in surface contact with the lower surface of the ceramic puck 130. Accordingly, by increasing the contact surface between the sealing member 240 and the electrostatic chuck body 110 and/or the contact surface between the sealing member 240 and the ceramic puck 130, sealing and heat transfer improvement effects may be implemented.

The sealing member 240 is formed of a material having elasticity, and the sealing member 240 is installed to be in surface contact with the lower surface of the ceramic puck 130 and is installed on the installation portion 116 having contact with the inclined surface 116*a*, the inside of the sealing member 240 may be sealed. Accordingly, the adhesive layer 120 may be prevented from being damaged by the process gas.

Figure 5:
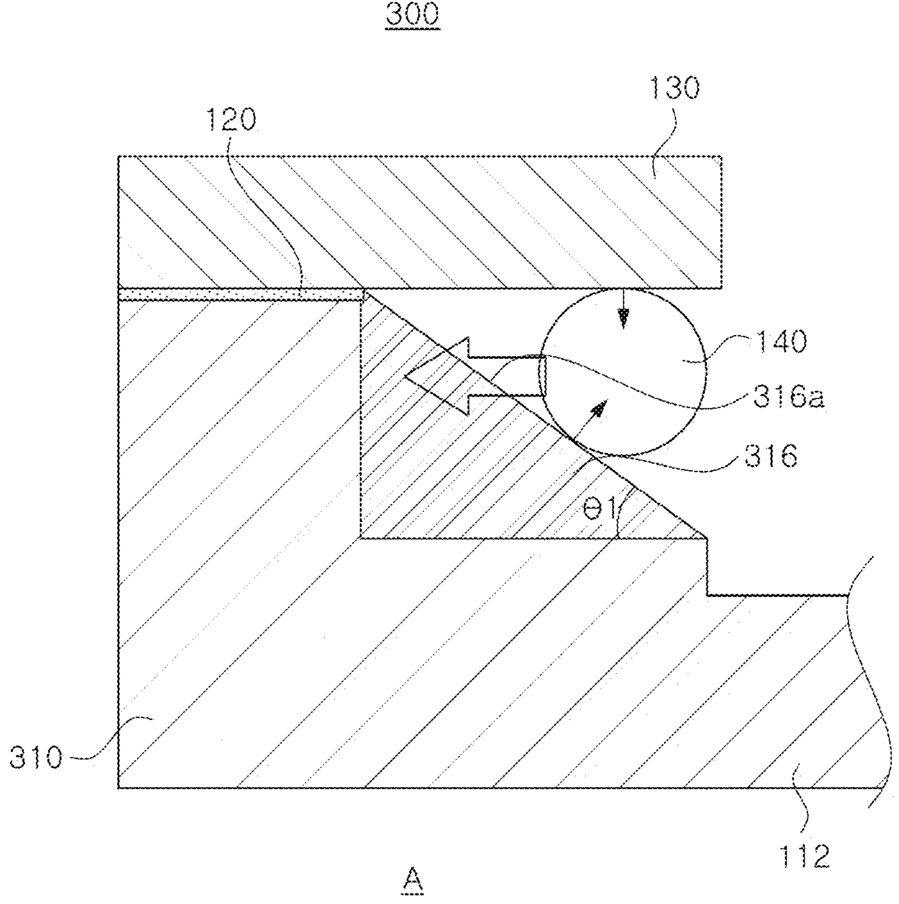
FIG. 5 is an enlarged view illustrating a region corresponding to FIG. 2 in an electrostatic chuck according to some example embodiments.
Figure 6:
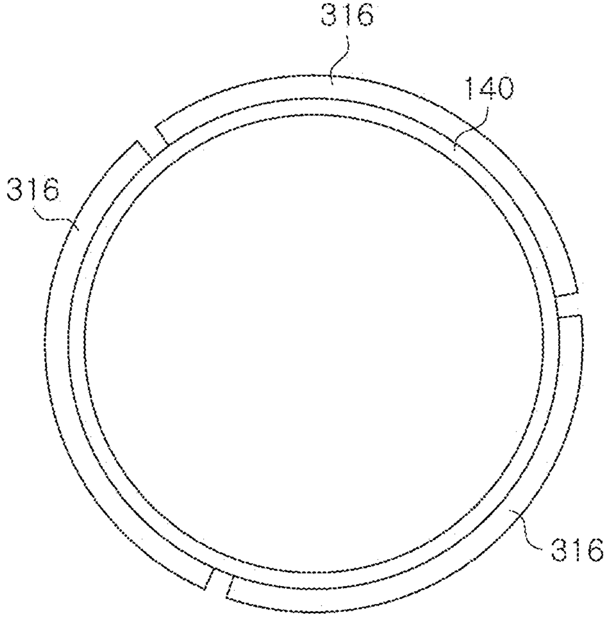
FIG. 6 is a plan view illustrating a sealing member and an installation portion of an electrostatic chuck according to some example embodiments.

FIG. 5 is an enlarged view illustrating a region corresponding to FIG. 2 of an electrostatic chuck 300 according to an example embodiment, and FIG. 6 is a plan view illustrating a sealing member 140 and an installation portion 316 of an electrostatic chuck 300 according to an example embodiment.

Referring to FIGS. 5 and 6, an electrostatic chuck 300 according to an example embodiment includes an electrostatic chuck body 310, an adhesive layer 120, a ceramic puck 130, and a sealing member 140.

Since the adhesive layer 120, the ceramic puck 130, and the sealing member 140 are substantially the same as the components described above, a detailed description thereof may be omitted and is substituted with the above description.

In some example embodiments, the electrostatic chuck body 310 may be provided with an installation portion 316 on which the sealing member 140 may be installed. The installation portion 316 may be disposed on an upper end portion of the electrostatic chuck body 310 and provides an installation space in which the sealing member 140 may be installed, together with the ceramic puck 130. The installation portion 316 may have a strip shape having a triangular cross section, in various example embodiments but are not limited thereto. For example, the installation portion 316 may be provided as a plurality of installation portions, and the plurality of installation portions 316 may be installed on the electrostatic chuck body 310 to form a circular annular shape. The plurality of installation portions 316 may be disposed to be spaced apart from each other at predetermined or dynamically determined intervals. However, although FIG. 6 illustrates the case of three installation portions 316 as an example, the present inventive concept is not limited thereto. The number of installation portions 316 may vary. As an example, the installation portion 416 may be formed to be one complete circular band. Furthermore, in various example embodiments, the electrostatic chuck body 310 may be formed of a metal and/or ceramic material including, at least one of, but not limited to, aluminum, stainless steel, aluminum nitride, aluminum oxide, or the like. The installation portion 316 may be formed of or may include a material with a hardness greater than or equal to the harness of the material of the electrostatic charge body 310. On the other hand, the installation portion 316 may have a right triangle shape in cross section, and the installation portion 316 may be provided with an inclined surface 316*a*.

The sealing member 140 may be configured to be in close contact with the installation portion 316 by utilizing the elastic properties (tensile deformation) of the sealing member 140 and stretching to increase the initial size, inserting into the installation portion 316, then allowing the sealing member 140 to relax creating a close contact with the inclined surface 316*a* of the installation portion 316 and the lower surface of the ceramic puck 130. When the sealing member 140 is installed on the installation portion 316, this generates a force in the lateral direction due to the restoring elastic force. The force generated in this lateral direction provides sufficient contact pressure for sealing the inclined surfaces 316*a* and the lower surface of the ceramic puck 130 with respect to the sealing member 140. Accordingly, sealing by the sealing member 140 may be implemented more reliably thus preventing the adhesive layer 120 from being damaged by the process gas.

Figure 7:
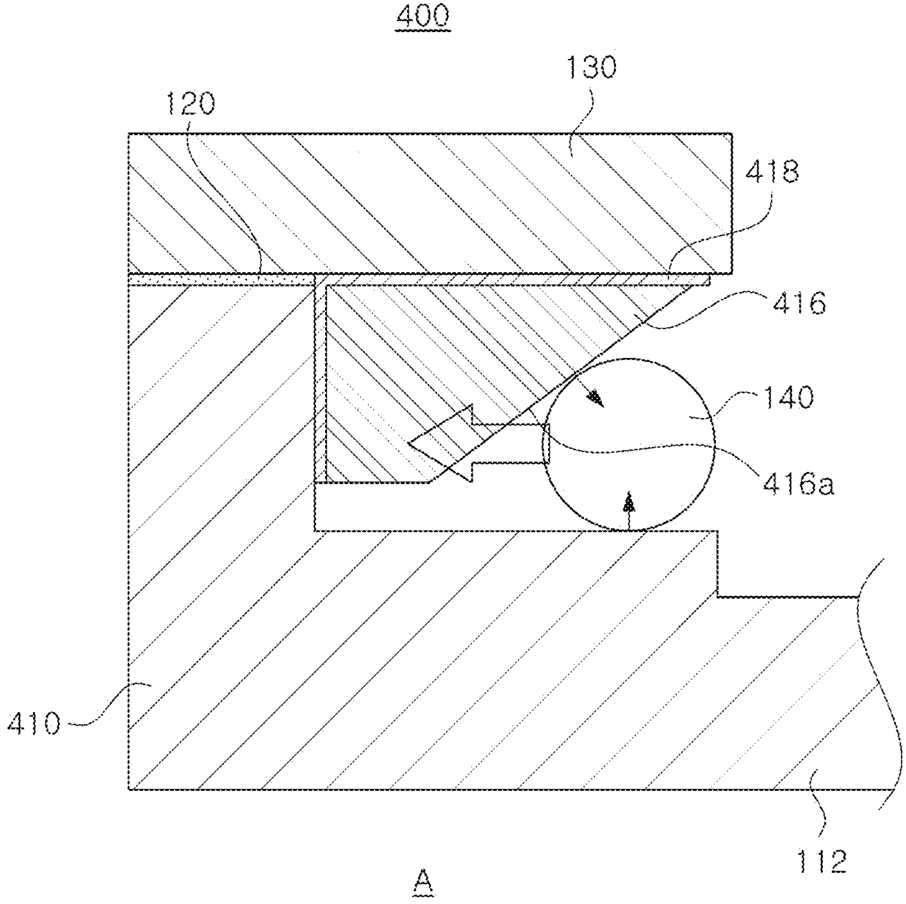
FIG. 7 is an enlarged view illustrating a region corresponding to FIG. 2 in an electrostatic chuck according to some example embodiments.
Figure 8:
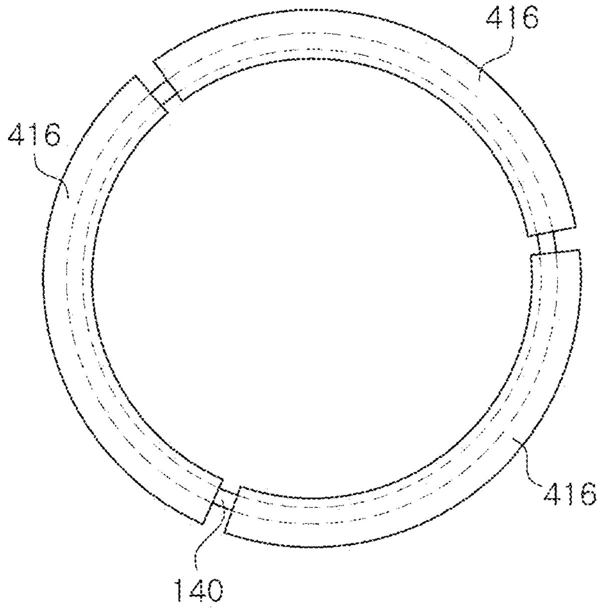
FIG. 8 is a plan view illustrating a sealing member and an installation portion of an electrostatic chuck according to some example embodiments.

FIG. 7 is an enlarged view illustrating a region corresponding to FIG. 2 in an electrostatic chuck 400 according to an example embodiment, and FIG. 8 is a plan view illustrating a sealing member 140 and an installation portion 416 of an electrostatic chuck 400 according to an example embodiment.

Referring to FIGS. 7 and 8, an electrostatic chuck 400 according to an example embodiment includes an electrostatic chuck body 410, an adhesive layer 120, a ceramic puck 130, and a sealing member 140.

Since the adhesive layer 120, the ceramic puck 130, and the sealing member 140 are substantially the same as the components described above, a detailed description thereof may be omitted and is substituted with the above description.

The electrostatic chuck body 410 may be provided with an installation portion 416 on which the sealing member 140 may be installed. The installation portion 416 may be disposed on the upper end portion of the electrostatic chuck body 410, below the ceramic puck 130, and provides an installation space in which the sealing member 140 may be installed. In some example embodiments, the installation portion 416 may have a band shape having a trapezoidal cross section, triangular cross section, or the like, however example embodiments are not limited thereto. The installation portion 416 may be provided as a plurality of installation portions, and the plurality of installation portions 416 may be installed on the electrostatic chuck body 410 to form a circular ring shape. On the other hand, the plurality of installation portions 416 may be spaced apart from each other at predetermined or dynamically determined intervals. However, although FIG. 7 illustrates the case of three installation portions 416 as an example, the present inventive concept is not limited thereto. The number of installation portions 416 may vary. As an example, the installation portion 416 may be formed to be one complete circular band. Furthermore, in various example embodiments, the electrostatic chuck body 410 may be formed of a metal and/or ceramic material including at least one of, aluminum, stainless steel, aluminum nitride, aluminum oxide, or the like. The installation portion 416 may be formed of a material with a hardness greater than or equal to the hardness of the material of the electrostatic chuck body 410. In addition, the installation portion 416 may be formed of a material having a high heat transfer coefficient to facilitate heat transfer. On the other hand, the installation portion 416 may be provided with an inclined surface 416*a*. A thermal interface material (TIM) 418 may be interposed between the installation portion 416 and the electrostatic chuck body 410 and between the installation portion 416 and the ceramic puck 130. Accordingly, heat transfer from the electrostatic chuck body 410 to the ceramic puck 130 may be performed more efficiently.

The sealing member 140 may be configured to be in close contact with the installation portion 416 by utilizing the elastic properties (tensile deformation) of the sealing member 140 and stretching to increase the initial size, inserting onto the installation portion 416, then allowing the sealing member 140 to relax creating a close contact with the inclined surface 416*a* of the installation portion 416 and one surface of a protrusion 412 of the electrostatic chuck body 410. When the sealing member 140 is installed on the installation portion 416, this generates a force in the lateral direction due to the restoring elastic force. The force generated in this lateral direction provides sufficient contact pressure for sealing the inclined surfaces 416*a* and one surface of the electrostatic chuck body 410 with respect to the sealing member 140. Accordingly, sealing by the sealing member 140 may be implemented more reliably thus preventing the adhesive layer 120 from being damaged by the process gas.

As set forth in the above example embodiments, an electrostatic chuck in which process gas may be prevented from flowing into a sealing member may be provided.

While example embodiments have been illustrated and described above, it may be apparent to those skilled in the art that modifications and variations could be made without departing from the scope of the present inventive concept as defined by the appended claims. Furthermore, example embodiments are not necessarily mutually exclusive with one another. For example, some example embodiments may include one or more features described with reference to one or more figures, and may also include one or more other features described with reference to one or more other figures.

What is claimed is:

1. An electrostatic chuck comprising:

an electrostatic chuck body having a step protruding from a lower end thereof in a radial direction;

an adhesive layer on an upper surface of the electrostatic chuck body;

a ceramic puck adhered to the adhesive layer and having an edge protruding from the upper surface of the electrostatic chuck body; and a sealing member on a lower edge portion of the ceramic puck, wherein the electrostatic chuck body is provided with an installation portion having an inclined surface, the sealing member is in contact with the inclined surface, wherein the sealing member is in contact with a bottom surface of the ceramic puck, and wherein the sealing member is a separate component from the adhesive layer.

2. The electrostatic chuck of claim 1, wherein the sealing member has a ring shape with a circular cross section.

3. The electrostatic chuck of claim 2, wherein the sealing member includes a material having elasticity and is configured to generate a restoring force by tension when installed on the installation portion.

4. The electrostatic chuck of claim 1, wherein the sealing member has a ring shape with a trapezoidal cross section.

5. The electrostatic chuck of claim 4, wherein a first surface of the sealing member is in surface contact with the inclined surface.

6. The electrostatic chuck of claim 5, wherein a second surface opposite to the first surface of the sealing member is in contact with the bottom surface of the ceramic puck.

7. The electrostatic chuck of claim 1, wherein the installation portion is fixed to the electrostatic chuck body and has a triangular cross section.

8. The electrostatic chuck of claim 5, wherein the installation portion is provided as a plurality of installation portions spaced apart from each other.

9. An electrostatic chuck comprising:

an electrostatic chuck body having a step protruding from a lower end thereof in a radial direction;

an adhesive layer on an upper surface of the electrostatic chuck body;

a ceramic puck adhered to the adhesive layer and having an edge protruding from the upper surface of the electrostatic chuck body; and a sealing member on a lower edge portion of the ceramic puck, wherein the electrostatic chuck body is provided with an installation portion having an inclined surface, the sealing member is in contact with a bottom surface of the ceramic puck, and a first surface of the sealing member is in surface contact with the inclined surface, wherein the installation portion is formed of a material having a hardness greater than or equal to the hardness of the electrostatic chuck body.

10. The electrostatic chuck of claim 1, wherein the installation portion is on a side surface of the electrostatic chuck body and the bottom surface of the ceramic puck, and has a trapezoidal cross section.

11. The electrostatic chuck of claim 10, wherein a thermal interface material (TIM) is interposed between the installation portion and the side surface of the electrostatic chuck body and between the installation portion and the bottom surface of the ceramic puck.

12. The electrostatic chuck of claim 10, wherein the installation portion includes a thermally conductive material.

13. The electrostatic chuck of claim 10, wherein the sealing member is in contact with the edge protruding from the upper surface of the electrostatic chuck body.

14. An electrostatic chuck comprising:

an electrostatic chuck body having a step protruding from a lower end thereof in a radial direction;

an adhesive layer on an upper surface of the electrostatic chuck body;

a ceramic puck adhered to the adhesive layer and having an edge protruding from the upper surface of the electrostatic chuck body; and a sealing member below the edge of the ceramic puck, wherein the electrostatic chuck body is provided with an installation portion having an inclined surface, and the sealing member includes a material having elasticity and is configured to generate a restoring force by tension when installed on the installation portion, wherein the sealing member is in contact with a bottom surface of the ceramic puck, and wherein the sealing member is a separate component from the adhesive layer.

15. The electrostatic chuck of claim 14, wherein the sealing member has a ring shape with a circular cross section.

16. The electrostatic chuck of claim 14, wherein the sealing member has a ring shape with a trapezoidal cross section.

17. The electrostatic chuck of claim 16, wherein a first surface of the sealing member is in surface contact with the inclined surface.

* * * * *